United States Patent [19]
Imhauser

[11] Patent Number: 5,492,844
[45] Date of Patent: Feb. 20, 1996

[54] METHOD OF MANUFACTURING INCREASED CONDUCTIVITY BASE CONTACT/FEEDERS WITH SELF-ALIGNED STRUCTURES

[75] Inventor: William P. Imhauser, Ambler, Pa.

[73] Assignee: SGS-Thomson Microelectronics, Inc., Carrollton, Tex.

[21] Appl. No.: 11,159

[22] Filed: Jan. 29, 1993

[51] Int. Cl.⁶ .................................................. H01L 21/265
[52] U.S. Cl. .............................. 437/31; 437/32; 437/27; 148/DIG. 10; 148/DIG. 11
[58] Field of Search ................................ 437/31, 32, 27; 148/DIG. 10, DIG. 11

[56] References Cited

U.S. PATENT DOCUMENTS 3,725,150  4/1973  George ..................................... 148/187
5,100,812  3/1992  Yamada et al. ............................ 437/31

FOREIGN PATENT DOCUMENTS 0438693  7/1991  European Pat. Off. ..
2581481  11/1986  France .
1153497  5/1969  United Kingdom .

Primary Examiner—George Fourson
Assistant Examiner—Long Pham
Attorney, Agent, or Firm—Allan Ratner; Renee M. Larson; Lisa K. Jorgenson

[57] ABSTRACT

A very deep P⁺ diffusion step is performed prior to the definition of a self-aligning emitter/P⁺ region. Furthermore, the initial P⁺ region is formed with dimensions sufficiently narrow to allow the subsequent emitter/P⁺ formation step to overlap the deeper P⁺ step by enough distance for the P⁺ step to completely cover the deep P⁺ region with its significant lateral diffusion. In this manner, a low sheet resistance in combination with proper alignment of the P⁺ heavy region with the emitter region is obtained.

6 Claims, 6 Drawing Sheets

METHOD OF MANUFACTURING INCREASED CONDUCTIVITY BASE CONTACT/FEEDERS WITH SELF-ALIGNED STRUCTURES

FIELD OF THE INVENTION

The present invention relates to a method of manufacturing self-aligned transistors and more specifically to a method of manufacturing transistors which are designed for high frequency applications. In particular, a method is disclosed for manufacturing self-aligned transistors with increased base feeder conductivity.

Background of the Invention

In a device which uses the base feeder as a diffused conductor stripe it is desirable to obtain as high a conductivity as possible. Of course, this conductivity must be obtained within the constraints of the pitch (the distance between two repetitive parts, e.g. the emitter or the base) of the geometry. For self-aligned structures, this conductivity has generally been limited to the conductivity obtained from a very heavy dose implant ($P^+$-$B^{11}$ at 1E16 dose). As a further complication, such a $P^+$ drive may result in a deeply driven base. Such a deeply driven base, in turn, adversely effects high frequency performance.

A top view of a typical self-aligned overlay geometry is shown in FIG. 20. FIG. 19 is a side cross sectional view of the device which is shown in FIG. 20 taken in the plane X—X'. As shown in FIG. 20, the device includes emitter stripe 41, $P^+$ light region 11 and $P^+$ heavy region 3.

The device which is shown in FIG. 19 and FIG. 20, which includes an implanted $P^+$ region, is typical of shallow geometry devices which are used for high frequency applications. However, for the device to exhibit desirable performance characteristics, a low sheet resistance has typically been required. If the sheet resistance is not sufficiently low, then the number of squares in the $P^+$ regions is often decreased in order to obtain an acceptable total resistance. However, decreasing the number of squares in the $P^+$ regions compresses the device which causes the figure of merit (emitter periphery/base area) to decrease. As is well known in the art, a reduction in the figure of merit of a device results in decreased power handling capabilities.

As explained above, a heavy $P^+$ drive may increase conductivity. However, such a $P^+$ drive (which creates a $P^+$ heavy region) after formation of a base region creates other problems. Specifically, formation of a $P^+$ heavy region is typically performed at very high temperatures. For example, a $P^+$ heavy region is typically performed at a temperature ranging from 1050° to 1100°. This is in contrast with base region formation which is typically performed using a driving step with a temperature between 900° and 950°. The difference between the temperature requirements for forming the base region and for forming the $P^+$ heavy region are particularly significant when one considers that there is a doubling of diffusion for every 25° increase in temperature. Thus, a base region is driven very deeply during formation of the $P^+$ heavy region.

A further consideration is the alignment of the $P^+$ heavy region with the emitter region. The edge of the $P^+$ heavy region is desirably well away from the edge of the $P^+$ light region because the $P^+$ heavy region is deeper than the $P^+$ region and the $P^+$ heavy region spreads out laterally during diffusion. In addition, it is not desirable for the $P^+$ heavy region to be offset with respect to the emitter region. If the $P^+$ heavy region was closer to one side of the emitter region than to another side of the emitter region, heavy injection on the closer side of the emitter region occurs, while no performance is obtained on the other side. Thus, the designer of such a device is always mindful of the fact that the $P^+$ heavy region is significantly narrower than the $P^+$ light region in order to align the $P^+$ heavy region well within the boundaries of the $P^+$ light region.

In order to resolve some of the problems set forth above, attempts have been made to form the $P^+$ heavy region before the base region is formed. This has involved the formation of a $P^+$ heavy region, stripping off of the $P^+$ heavy region to form an indentation in the silicon and then trying to form an emitter which is aligned with the indentation. Accurate alignment in this manner is difficult to obtain.

Summary of the Invention

A self-aligned overlay geometry is formed by creating a very deep $P^+$ heavy region prior to definition of a self-aligning $P^+$ light region and a self-aligning emitter region. Furthermore, a $P^+$ heavy region is formed which is narrow enough to ensure that a subsequent $P^+$ light formation step sufficiently overlaps the deeper $P^+$ heavy region.

BRIEF DESCRIPTION OF THE FIGURES

FIG. 19 is a side cross-sectional view of a portion of FIG. 20 taken in the plane X—X'.

DETAILED DESCRIPTION

An exemplary embodiment of the present invention will now be described more fully with reference to FIGS. 1–19, in which a semiconductor device is shown during successive stages of manufacture. These figures are purely schematic and are not drawn to scale. In particular, the dimensions in the direction of thickness are comparatively strongly exaggerated for the sake of clarity.

Figure 1:
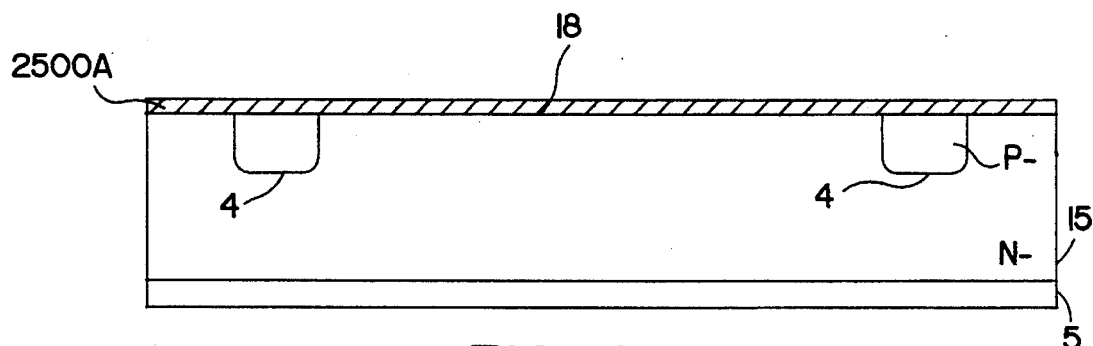
FIGS. 1–19 are side cross-sectional views of a semiconductor device at various stages of manufacture in accordance with an exemplary embodiment of the method of the present invention.

As shown in FIG. 1, the starting material is a semiconductor wafer, in this example, epitaxial layer 15 of doped N-type silicon having a resistivity of, for example, 2 ohm cm. Epitaxial layer 15 is located above substrate 5. A base diffusion layer 18 is formed on the top surface of epitaxial layer 15. This base diffusion layer may have a depth of about 0.3 microns. Other depths are possible and will be chosen by those skilled in the art in accordance with existing conditions. Furthermore, P– regions 4 are formed by the implantation of boron ions (dose $5\times10^{12}$ atoms/cm$^3$ energy 100 keV) followed by well known diffusion techniques.

Figure 2:
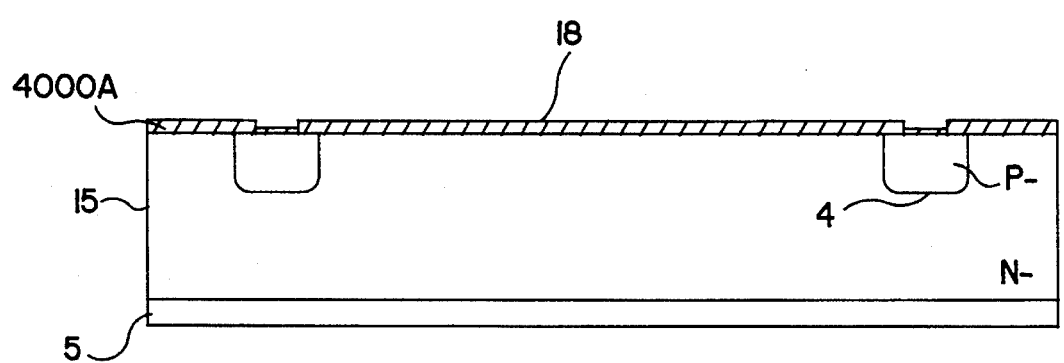

As shown in FIG. 2, the semiconductor device is subjected to a P– drive. This results in the growth of the previously deposited oxide layer, as well as the formation of oxide over the previously exposed portions of P– regions 4.

Figure 3:
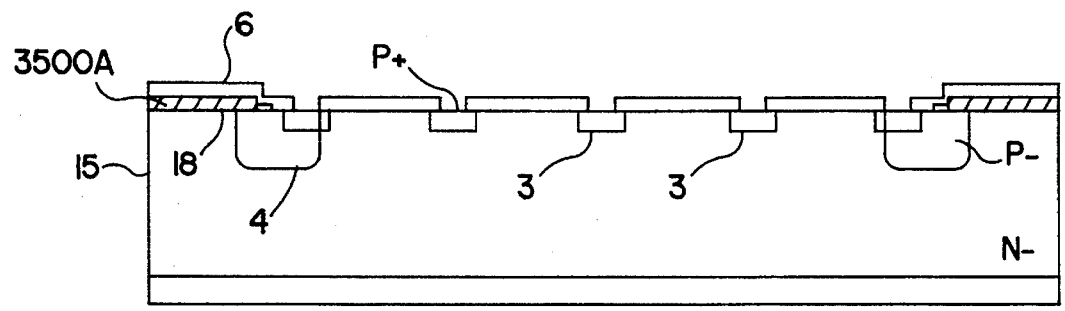

As shown in FIG. 3, portions of oxide layer 18 are removed to expose portions of P– regions 4 and epitaxial layer 15. The removal of portions of oxide layer 18 is accomplished using well known "mask and etch" technology. A further oxide layer 6 is then deposited on the wafer. Portions of this further oxide layer are then removed using mask and etch technology. P⁺ regions 3 are then formed in epitaxial layer 15 at the top surface of the semiconductor device, as shown in FIG. 3, using well known diffusion techniques, such as a high concentration diffusion step at a high temperature range of approximately 1050 to 1100 degrees Celsius. Examples include a high concentration solid Boron Nitride diffusion step, a high dosage Boron Chloride gas diffusion step, or a high dosage Boron ion implantation drive step, including rapid thermal anneal, at the high temperature.

Figure 4:
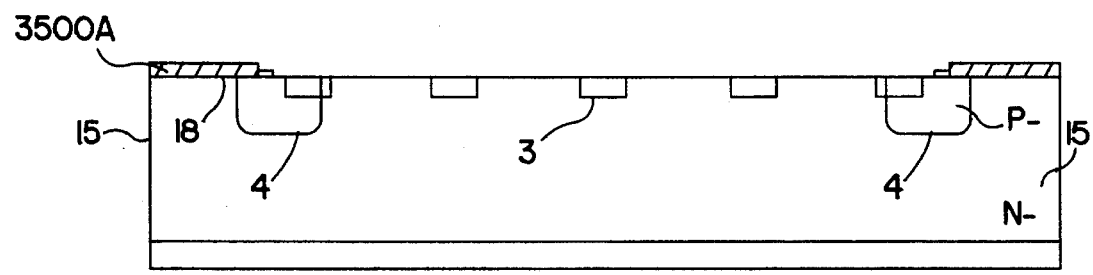
Figure 5:
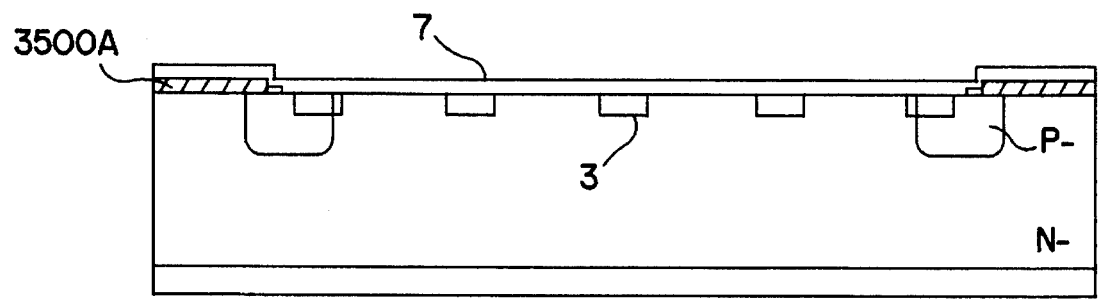
Figure 6:
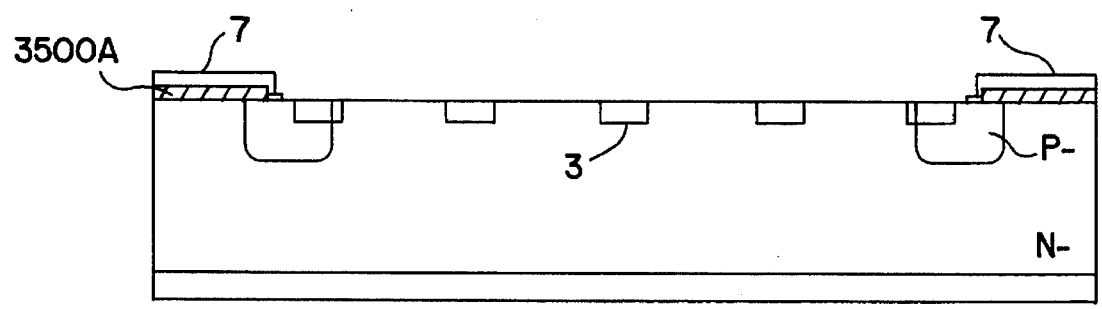

As shown in FIG. 4, oxide layer 6 is then removed. As shown in FIG. 5, a further oxide layer 7 is deposited on the wafer. Then, as shown at FIG. 6, a substantially large portion of oxide layer 7 is removed.

Figure 7:
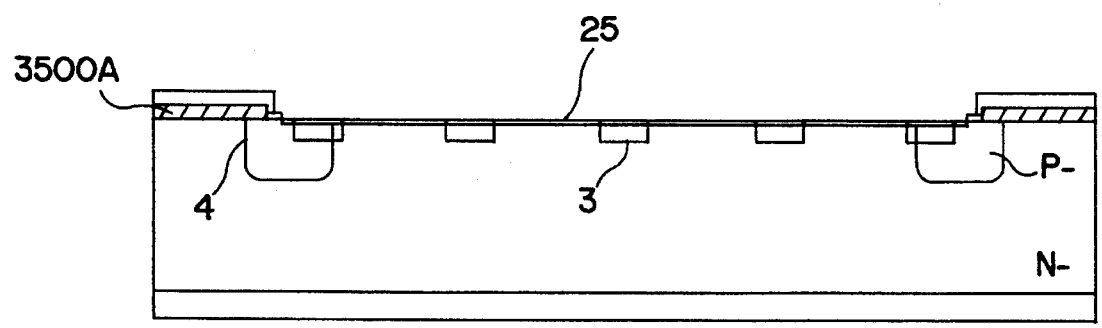

Next, as shown in FIG. 7, a shallow base region 25 is provided by implantation. This is accomplished using, for example, boron ions, dose 6E13, energy 25 keV.

Figure 8:
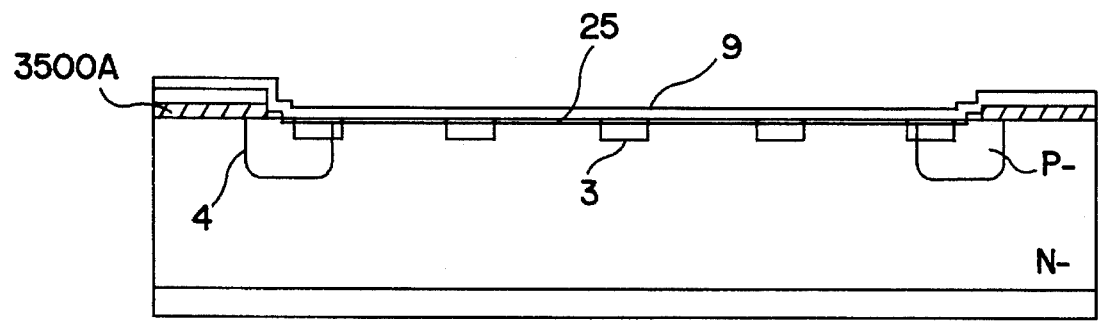

As shown in FIG. 8, base implantation region 25 is then covered with nitride layer 9.

Figure 9:
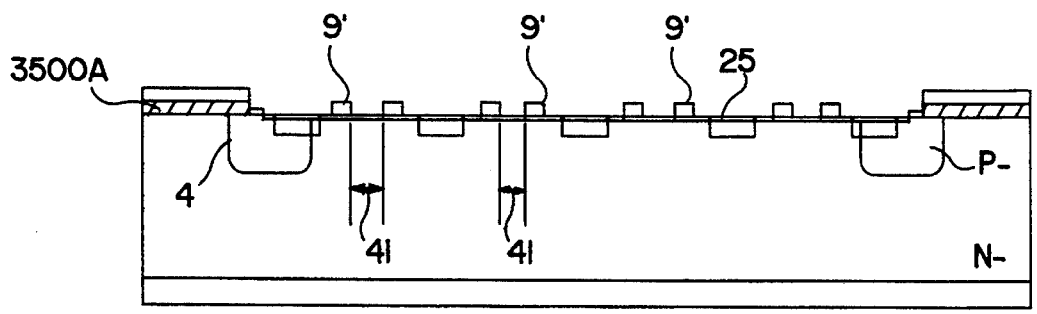

Then, as shown in FIG. 9, portions of nitride layer 9 are removed to create nitride islands 9'. The formation of nitride island 9' define emitter regions 41 as shown in FIG. 9. Emitter regions 41 are formed using well known ion implantation and activation steps; Arsenic ion implantation is commonly used. As shown, emitter regions 41 are formed at the surface of the semiconductor device and are separated from shallow P⁺ region 11 by nitride spacers 9'.

Figure 10:
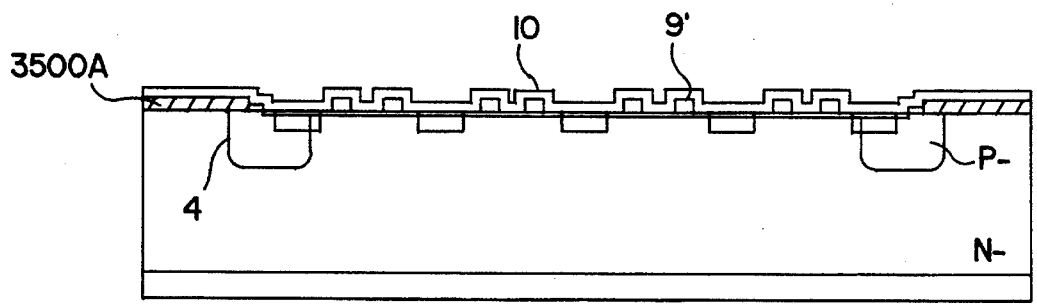
Figure 11:
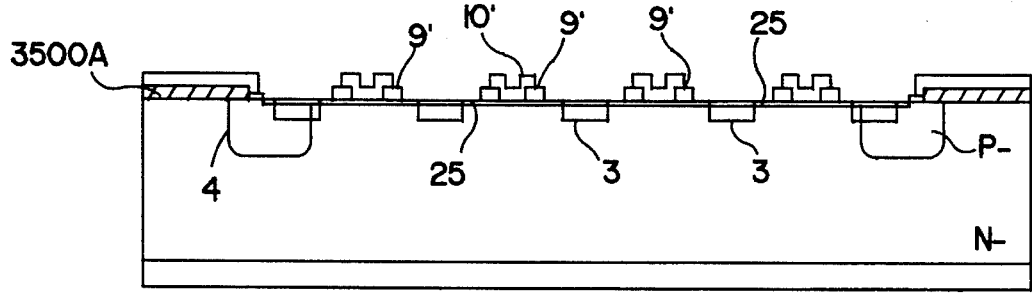

As shown in FIG. 10, an oxide layer is deposited over nitride islands 9'. In FIG. 11, portions of oxide layer 10 are removed so that oxide islands 10' remain.

Figure 12:
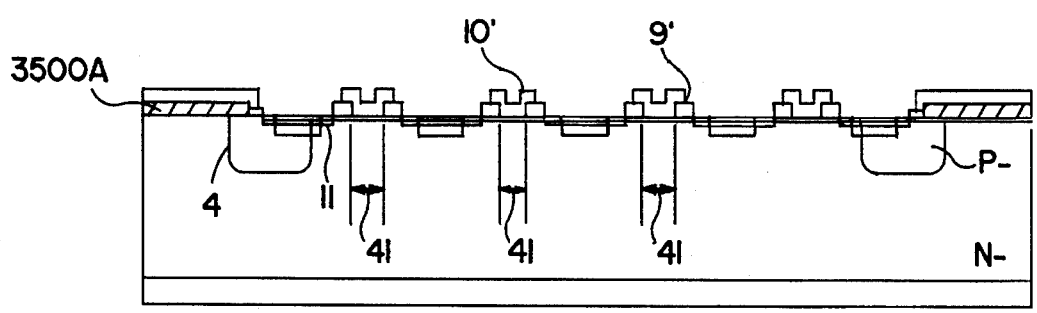

As shown in FIG. 12, P⁺ implant regions 11 having a shallower depth than deep P⁺ implant region 3, are formed. This may be accomplished using, for example, $B^{11}$ ($5 \times 10^{15}$ atoms/cm³, 25 keV). A typical depth for P⁺ implant regions 11 is, for example, 0.5 microns. This is compared to a typical depth for base region 25 of, for example, 0.3 microns. Thus, for purposes of clarity, base region 25 is not shown in FIG. 12. Formation of shallow P⁺ implant regions 11 simultaneously isolates emitter regions 41 from the deep P⁺ regions. Nitride islands 9' operate as spacers which isolate emitter regions 41 from the P⁺ regions, as shown in FIG. 12.

Figure 13:
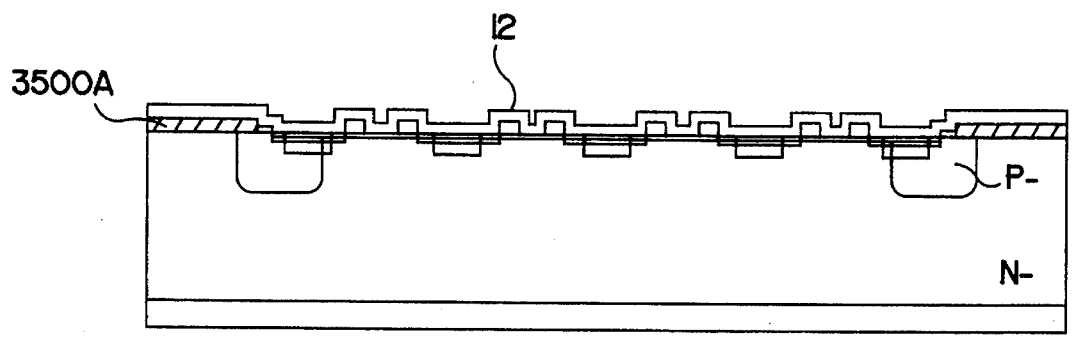
Figure 14:
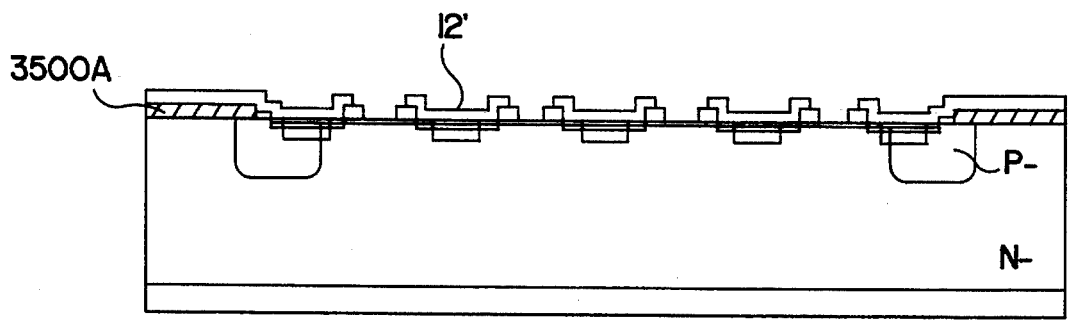

As shown in FIG. 13, an oxide layer 12 is again deposited over the wafer. Portions of this oxide layer are then removed as shown in FIG. 14 so that oxide islands 12' remain.

Figure 15:
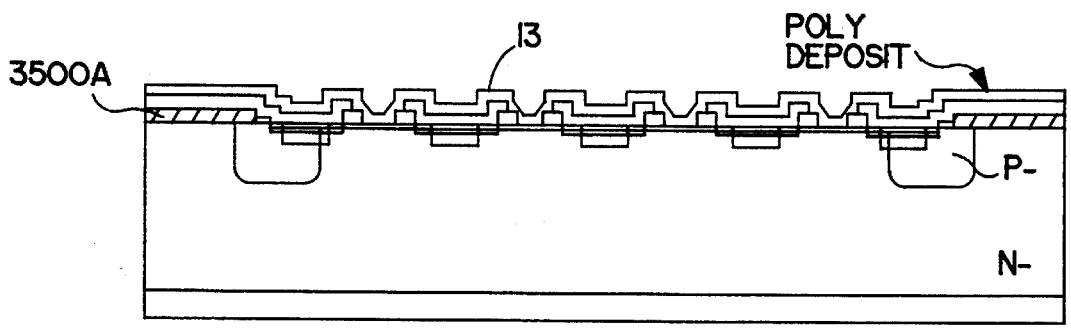
Figure 16:
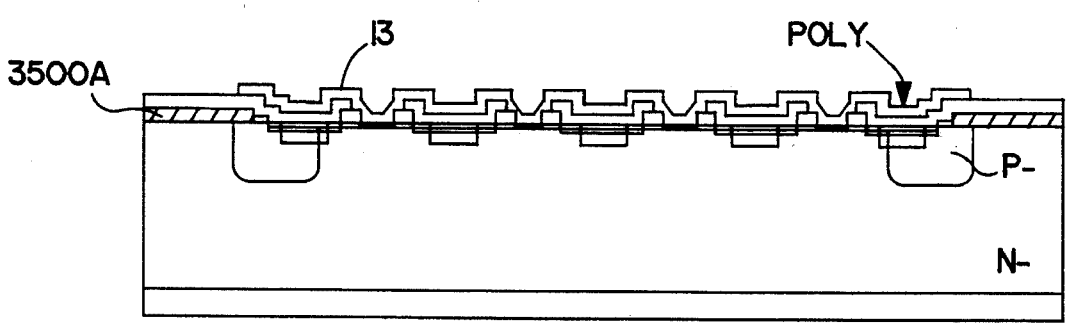

As shown in FIG. 15, a layer of polysilicon 13 is then deposited over the wafer surface. Portions of this polysilicon layer 13 are removed in the step which is illustrated by FIG. 16.

Figure 17:
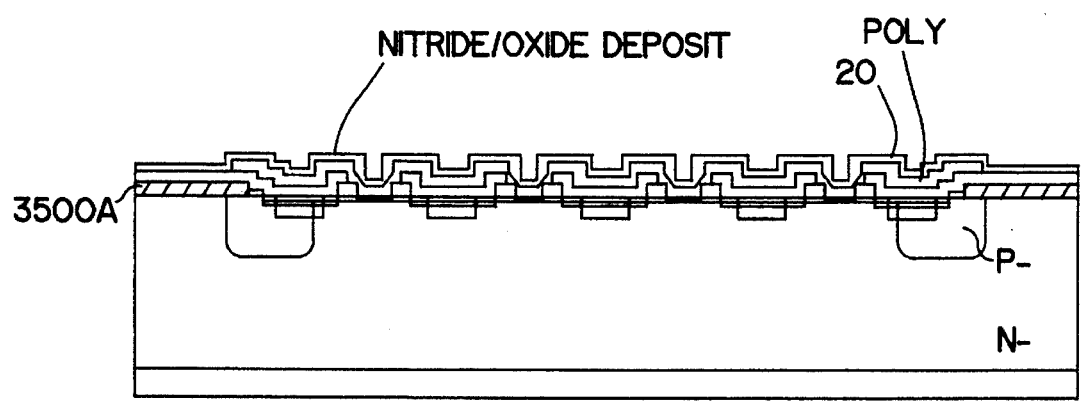
Figure 18:
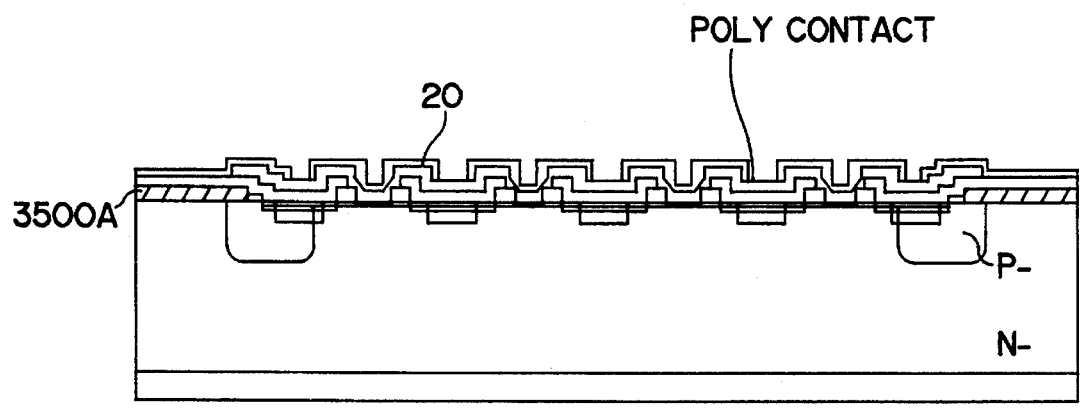

As shown in FIG. 17, a nitride oxide layer 20 is then deposited over the wafer surface. Portions of nitride oxide layer 20 are then removed, as shown in FIG. 18, to form polycontacts. Metallization layer 21 is then provided as shown in FIG. 19 to form emitter metal 21 and base metal 22.

Figure 19:
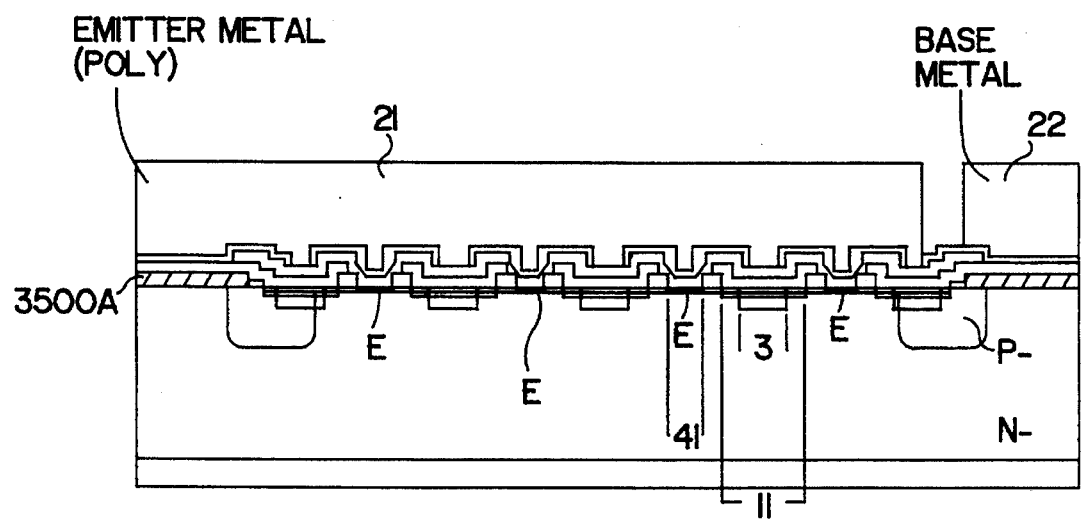
Figure 20:
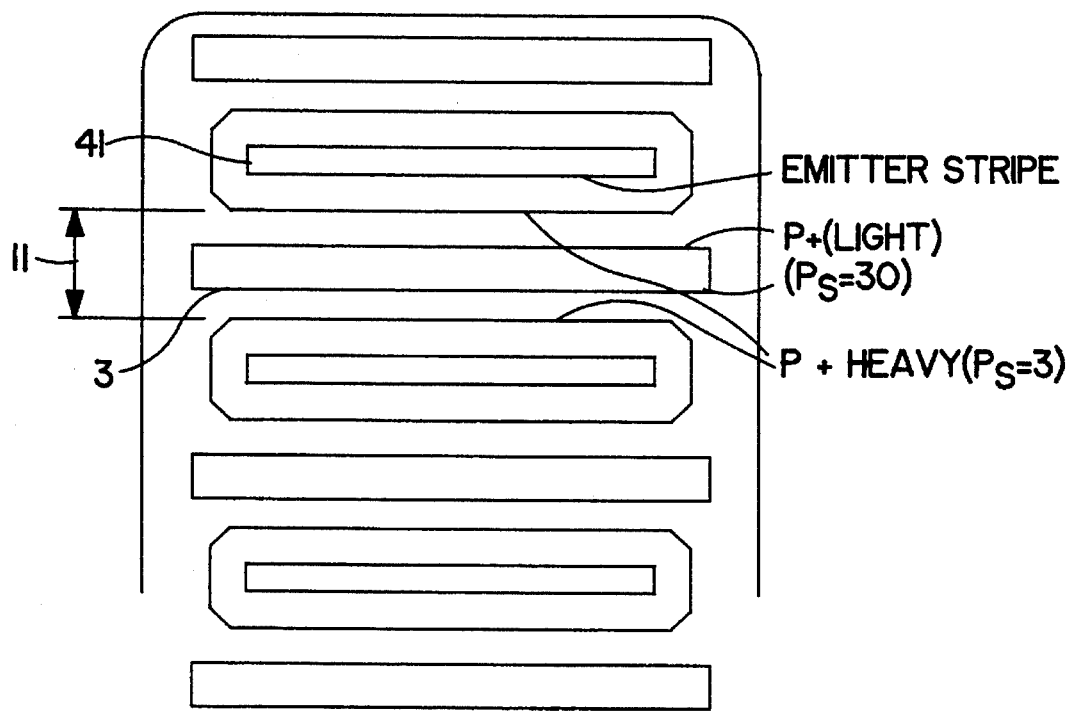
FIG. 20 is a top view of a semiconductor device at the stage of manufacture illustrated by FIG. 19.

FIG. 20 provides a top view of the device which is shown in FIG. 19. FIG. 19 is a side cross-sectional view of a portion of the device which is shown in FIG. 20 taken in the plane X—X'. As shown by both FIG. 19 and FIG. 20, P⁺ light region 11 extends beyond the upper surface of P⁺ heavy region 3. Furthermore, P⁺ heavy region 3 is aligned with respect to each emitter region 41.

By forming a very deep P⁺ heavy region 3 prior to definition of emitter region 41 and P⁺ light region 11, and by forming P⁺ heavy region 3 with dimensions that are narrow enough to allow the subsequent P⁺ light region 11 formation step to overlap the deeper P⁺ heavy region 3 with sufficient dimensions, proper spacing is ensured. In other words, it is guaranteed that P⁺ region will not be too close to either side of emitter region 41 because P⁺ heavy region 3 has been completely covered with P⁺ light region 11 through self-alignment. In this manner, a self-aligned overlay geometry is formed by the relative positioning of emitter region 41, shallow P⁺ region 11, P⁺ deep region 3, and base region 25 with respect to one another.

The overlap of P⁺ light region 11 over P⁺ heavy region 3 is important because if P⁺ light region 11 does not extend past P⁺ heavy region 3 laterally, automatic self-alignment is not obtained. In a typical case of an overlay geometry with a figure of merit between 5 and 6, the width of P⁺ light region 11 is 3 to 4 microns. With allowances for misalignment and registration, a deep P⁺ heavy region 3 of approximately 1.5 microns can be chosen and will still allow approximately ¾ micron of overlap to ensure preservation of the self-alignment feature in order to guarantee that the P⁺ heavy region does not get too close to a single emitter region. In this manner, a P⁺ heavy region is obtained which is well within the P⁺ light region without the injection nonuniformity which is obtained by using a P⁺ heavy region within an aligned emitter.

Furthermore, the P⁺ heavy region overcomes the disadvantages of the P⁺ light region in terms of high conductivity because the P⁺ heavy region can be as low as 3 ohms per square or less. This allows between a factor of two to three times reduction in resistivity of the P⁺ region (i.e. the combination of the P⁺ heavy region and the P⁺ light region). This can improve the effective figure of merit for RF overlay transistors by 30 to 40 percent. In this manner, efficiency and RF power output may be enhanced by significant factors.

While the invention has been described in terms of an exemplary embodiment, it is contemplated that it may be practiced as outlined above with modifications within the spirit and scope of the following claims.

What is claimed:

1. A method for forming a self-aligned semiconductor device, comprising the steps of:

a) forming a deep P⁺ region in an epitaxial layer at a top surface of a semiconductor device, wherein the deep P⁺ region is formed using a high concentration diffusion step at high temperature;

b) forming a base region by ion implantation after formation of said deep P⁺ region, at the top surface of the semiconductor device and over the deep P⁺ region; and c) forming a shallow P⁺ region, with doping concentration and depth less than said deep P⁺ region, by implantation which overlaps said deep P⁺ region, which simultaneously isolates the emitter region from said deep P⁺ region, wherein the emitter region is formed at the top surface of the semiconductor device and is separated from the shallow P⁺ region by a spacer, wherein said shallow P⁺ region overlaps the deep P⁺ region so that alignment between said deep P⁺ region and said emitter region is maintained, and wherein said shallow P⁺ region has a depth which is less than the depth of said deep P⁺ region.

2. A method for forming a self-aligned semiconductor device according to claim 1, wherein said emitter region, said base region, said deep $P^+$ region and said shallow $P^+$ region are positioned to form a self-aligned overlay geometry.

3. A method for forming a self-aligned semiconductor device according to claim 1, further comprising the steps of:
   d depositing a polysilicon layer; and
   e) removing a portion of said polysilicon layer to expose said emitter region.

4. The method of claim 1, wherein the deep $P^+$ region is formed by a high concentration of solid Boron Nitride.

5. The method of claim 1, wherein the deep $P^+$ region is formed by a high concentration of Boron Chloride gas.

6. The method of claim 1, wherein the deep $P^+$ region is formed by a high dosage Boron ion implantation drive.

* * * * *